US011982589B2

(12) United States Patent
Jiang et al.

(10) Patent No.: US 11,982,589 B2
(45) Date of Patent: May 14, 2024

(54) MAGNETIC LEVITATION TEST SYSTEM AND ELECTROMAGNET TEST METHOD

(71) Applicant: CRRC QINGDAO SIFANG CO., LTD., Shandong (CN)

(72) Inventors: Fujie Jiang, Shandong (CN); Jian Chen, Shandong (CN); Yanmin Li, Shandong (CN); Xin Miao, Shandong (CN); Shouliang Jiang, Shandong (CN)

(73) Assignee: CRRC QINGDAO SIFANG CO., LTD., Shandong (CN)

( * ) Notice: Subject to any disclaimer, the term of this patent is extended or adjusted under 35 U.S.C. 154(b) by 530 days.

(21) Appl. No.: 17/285,106

(22) PCT Filed: Oct. 17, 2019

(86) PCT No.: PCT/CN2019/111611
§ 371 (c)(1),
(2) Date: Apr. 14, 2021

(87) PCT Pub. No.: WO2020/147352
PCT Pub. Date: Jul. 23, 2020

(65) Prior Publication Data
US 2021/0348984 A1    Nov. 11, 2021

(30) Foreign Application Priority Data
Jan. 14, 2019   (CN) .......................... 201910032372.5

(51) Int. Cl.
*G01M 17/08*     (2006.01)
*B60L 13/06*     (2006.01)
(Continued)

(52) U.S. Cl.
CPC ............. *G01M 17/08* (2013.01); *B60L 13/06* (2013.01); *B60T 17/228* (2013.01); *G01R 31/00* (2013.01); *B60L 2200/26* (2013.01)

(58) Field of Classification Search
CPC .... G01M 17/08; B60L 13/06; B60L 2200/26; B60T 17/228; G01R 31/00
(Continued)

(56) References Cited

U.S. PATENT DOCUMENTS 3,890,906 A * 6/1975 Maki ...................... B60L 13/10
                                                      505/905
4,505,206 A * 3/1985 Gottzein ................. B60L 13/06
                                                      318/135
(Continued)

FOREIGN PATENT DOCUMENTS

CN        103064038 A      4/2013
CN        103954844 A      7/2014
(Continued)

OTHER PUBLICATIONS

International Search Report for PCT/CN2019/111611 dated Jan. 15, 2020 , ISA/CN.
(Continued)

*Primary Examiner* — Richard A Goldman
(74) *Attorney, Agent, or Firm* — Yue (Robert) Xu; Apex Attorneys at Law, LLP

(57) ABSTRACT

A magnetic levitation test system and an electromagnet test method. A vehicle-mounted controller (1024), an electromagnet controller, and an electromagnet are subjected to joint test by means of the magnetic levitation test system integrated with a vehicle-mounted controller test bed (102), an electromagnet controller test bed (104), and an electromagnet test bed (106). The running condition of a train can be simulated, and the vehicle-mounted controller (1024), the electromagnet controller, and the electromagnet are subjected to joint test under the simulated running condition of the train. Therefore, the vehicle-mounted controller (1024), the electromagnet controller, and the electromagnet are subjected to function verification, thereby reducing the fault (Continued)

rate when the vehicle-mounted controller (1024), the electromagnet controller, and the electromagnet are used at the same time.

7 Claims, 4 Drawing Sheets

(51) Int. Cl.
 *B60T 17/22* (2006.01)
 *G01R 31/00* (2006.01)
(58) Field of Classification Search
 USPC .......................................................... 701/19
 See application file for complete search history.

(56) References Cited

U.S. PATENT DOCUMENTS

| | | | | | |
|---|---|---|---|---|---|
| 4,587,472 | A | * | 5/1986 | Steinmetz | B60L 13/06 318/135 |
| 5,094,173 | A | * | 3/1992 | Tada | B61B 13/08 104/282 |
| 5,154,268 | A | * | 10/1992 | Heuer | B60K 23/02 477/901 |
| 5,445,347 | A | * | 8/1995 | Ng | G08G 9/00 246/169 R |
| 6,079,258 | A | * | 6/2000 | List | G01M 17/007 73/116.06 |
| 6,754,615 | B1 | * | 6/2004 | Germann | B60C 19/00 73/146 |
| 7,357,085 | B2 | * | 4/2008 | Chen | F16C 32/0472 104/282 |
| 9,718,486 | B1 | * | 8/2017 | Shubs, Jr. | B61L 15/0027 |
| 11,366,038 | B1 | * | 6/2022 | Deng | G01H 1/12 |
| 11,656,153 | B1 | * | 5/2023 | Boecker | G01M 13/025 73/118.01 |
| 11,761,851 | B1 | * | 9/2023 | Gohil | G01M 13/021 74/89.42 |
| 2003/0112105 | A1 | * | 6/2003 | Post | H01F 7/0236 335/289 |
| 2004/0163451 | A1 | * | 8/2004 | Kim | G01M 17/08 73/115.01 |
| 2009/0283008 | A1 | * | 11/2009 | Schmid | B60L 13/06 104/284 |
| 2010/0019763 | A1 | * | 1/2010 | Schmid | B60L 13/06 324/260 |
| 2010/0126373 | A1 | * | 5/2010 | Schmid | B60L 13/10 104/282 |
| 2011/0252876 | A1 | * | 10/2011 | Ma | G01M 17/08 73/116.01 |
| 2012/0048026 | A1 | * | 3/2012 | van der Linden | G01M 7/025 73/760 |
| 2012/0123646 | A1 | | 5/2012 | Mantini et al. | |
| 2012/0325726 | A1 | * | 12/2012 | Lehtinen | B03C 1/03 209/214 |
| 2014/0266264 | A1 | * | 9/2014 | Gunawan | G01N 27/04 324/691 |
| 2015/0251562 | A1 | * | 9/2015 | Yang | F16D 63/002 188/164 |
| 2016/0257220 | A1 | | 9/2016 | Irvin, Sr. et al. | |
| 2016/0377500 | A1 | * | 12/2016 | Bizub | G01N 29/14 73/35.03 |
| 2018/0154848 | A1 | * | 6/2018 | Agrawal | B60L 13/04 |
| 2020/0377131 | A1 | * | 12/2020 | Liang | B61L 15/0072 |
| 2021/0248290 | A1 | * | 8/2021 | Wei | G06Q 10/047 |
| 2021/0348984 | A1 | * | 11/2021 | Jiang | F16D 63/008 |
| 2022/0115965 | A1 | * | 4/2022 | Zheng | B60L 13/06 |
| 2022/0244142 | A1 | * | 8/2022 | Breton | G01M 17/0072 |
| 2022/0315076 | A1 | * | 10/2022 | Fan | B61L 15/0027 |
| 2022/0379930 | A1 | * | 12/2022 | Fons Sánchez | B61B 13/08 |
| 2023/0031854 | A1 | * | 2/2023 | Ding | B60L 13/06 |
| 2023/0160782 | A1 | * | 5/2023 | Deng | B60L 13/06 104/281 |
| 2023/0190158 | A1 | * | 6/2023 | Howard | A61B 5/165 600/301 |
| 2023/0252824 | A1 | * | 8/2023 | Merg | G07C 5/008 701/29.4 |
| 2023/0252830 | A1 | * | 8/2023 | Merg | G07C 5/006 701/29.1 |
| 2023/0286552 | A1 | * | 9/2023 | Baker | B61B 13/08 104/284 |
| 2023/0288269 | A1 | * | 9/2023 | Kaal | G01L 1/10 73/862.59 |
| 2023/0304897 | A1 | * | 9/2023 | Scheucher | G01M 17/013 73/118.01 |

FOREIGN PATENT DOCUMENTS

| | | | | |
|---|---|---|---|---|
| CN | 104527451 | A | | 4/2015 |
| CN | 106569157 | A | | 4/2017 |
| CN | 109141946 | A | | 1/2019 |
| CN | 109725221 | A | * | 5/2019 ............. B60L 13/06 |
| CN | 109725221 | A | | 5/2019 |
| JP | S62225106 | A | | 10/1987 |
| JP | S64440 | A | | 1/1989 |
| JP | H03173346 | A | | 7/1991 |
| JP | 2003032810 | A | | 1/2003 |
| JP | 2008298473 | A | | 12/2008 |
| WO | 2006/028318 | A1 | | 3/2006 |
| WO | WO-2013130888 | A1 | * | 9/2013 ............. B01D 45/14 |

OTHER PUBLICATIONS

Search Report dated Sep. 9, 2022 for European patent application No. 19910669.1.
Pilat A et al., "Propulsion control of the semi-magnetically levitated cart", Electrodynamic and mechatronic system (SELM), 2013 International Symposium on, IEEE, May 15, 2013, pp. 23-26.
First Office Action dated Sep. 8, 2021 for Japanese patent application No. 2020-559450, English translation provided by Global Dossier.

* cited by examiner

MAGNETIC LEVITATION TEST SYSTEM AND ELECTROMAGNET TEST METHOD

This application is a National Stage application of PCT international application PCT/CN2019/111611, filed on Oct. 17, 2019, which claims the priority to Chinese Patent Application No. 201910032372.5, titled "MAGNETIC LEVITATION TEST SYSTEM AND ELECTROMAGNET TEST METHOD", filed on Jan. 14, 2019 with the China National Intellectual Property Administration (CNIPA), which are incorporated herein by reference in their entirety.

FIELD

The present disclosure relates to the technical field of data processing, and in particular to a magnetic levitation test system and an electromagnet test method.

BACKGROUND

At present, the maximum operating speed of the high-speed magnetic levitation train in China reaches 503 kilometers per hour. Such ultra-high-speed operation requires a vehicle on-board controller, an electromagnet controller and an electromagnet used in the magnetic levitation train to have higher performance. Therefore, detection on the vehicle on-board controller, the electromagnet controller and the electromagnet is very important in research, design, production and experiment.

According to the conventional technology, there is no test apparatus for the vehicle on-board controller, the electromagnet controller and the electromagnet in the high-speed magnetic levitation train, resulting in that the vehicle on-board controller, the electromagnet controller and the electromagnet cannot be tested.

SUMMARY

To solve the above problems, a magnetic levitation test system and an electromagnet test method are provided in embodiments of the present disclosure.

In a first aspect, a magnetic levitation test system is provided in an embodiment of the present disclosure. The magnetic levitation test system includes: a central control unit, a vehicle on-board controller test-bed, an electromagnet controller test platform, and an electromagnet test-bed, in which
the central control unit is respectively connected to the vehicle on-board controller test-bed, the electromagnet controller test platform and the electromagnet test-bed; the vehicle on-board controller test-bed is connected to the electromagnet controller test platform; and the electromagnet controller test platform is connected to the electromagnet test-bed;
an electromagnet is mounted on the electromagnet test-bed;
the central control unit is configured to transmit a control command to the vehicle on-board controller test-bed;
the vehicle on-board controller test-bed is configured to transmit the control command to the electromagnet controller test platform;
the electromagnet controller test platform is configured to generate an electromagnet test command based on the control command, to test the electromagnet mounted on the electromagnet test-bed; and
the electromagnet test-bed is configured to execute the electromagnet test command transmitted from the electromagnet controller test platform, to test the mounted electromagnet.

In a second aspect, an electromagnet test method is further provided in an embodiment of the present disclosure. The electromagnet test method is applied to the above magnetic levitation test system, and includes:
receiving, by a levitation controller, a first floating command transmitted from an electromagnet controller test-bed, wherein the first floating command carries a gap value between a levitation electromagnet and a long stator;
determining an output voltage corresponding to the gap value between the levitation electromagnet and the long stator based on a relationship between gap values and output voltages, and supplying power to the levitation electromagnet on the electromagnet test-bed through a circuit breaker and switchgear based on the determined output voltage, for a gap between the levitation electromagnet and the long stator to reach the gap value between the levitation electromagnet and the long stator carried in the first floating command; and
obtaining a speed, an acceleration, and a gap value when the levitation electromagnet is floating, and transmitting the obtained speed, acceleration, and gap value when the levitation electromagnet is floating to a vehicle on-board controller.

In a third aspect, an electromagnet test method is further provided in an embodiment of the present disclosure. The electromagnet test method is applied to the above magnetic levitation test system, and includes:
receiving, by a steering controller, a second floating command transmitted from an electromagnet controller test-bed, wherein the second floating command carries a gap value between a steering electromagnet and a long stator;
determining an output voltage corresponding to the gap value between the steering electromagnet and the long stator based on a relationship between gap values and output voltages, and supplying power to the steering electromagnet on the electromagnet test-bed through a circuit breaker and switchgear based on the determined output voltage, for a gap between the steering electromagnet and the long stator to reach the gap value between the steering electromagnet and the long stator carried in the second floating command; and
obtaining a speed, an acceleration, and a gap value when the steering electromagnet is floating, and transmitting the obtained speed, acceleration, and gap value when the steering electromagnet is floating to a vehicle on-board controller.

In a fourth aspect, an electromagnet test method is further provided in an embodiment of the present disclosure. The electromagnet test method is applied to the above magnetic levitation test system, and includes:
receiving, by a brake controller, a brake command transmitted from an electromagnet controller test-bed, wherein the brake command carries a braking level of a brake electromagnet;
determining an output voltage corresponding to the braking level carried in the brake command based on a relationship between braking levels and output voltages, and supplying power to the brake electromagnet on the electromagnet test-bed through a circuit breaker and switchgear based on the determined output voltage, for the brake electromagnet to perform braking operation based on the braking level carried in the brake command; and
obtaining a speed, an acceleration, and a gap value when the brake electromagnet is performing braking operation, and transmitting the obtained speed, acceleration, and gap value when the brake electromagnet is performing braking operation to a vehicle on-board controller.

With the solutions provided in the first to fourth aspects of the embodiments of the present disclosure, joint test is performed on the vehicle on-board controller, the electromagnet controller and the electromagnet by using the magnetic levitation test system integrated with the vehicle on-board controller test-bed, the electromagnet controller test platform and the electromagnet test-bed. Compared with the conventional technology in which the vehicle on-board controller, the electromagnet controller and the electromagnet cannot be tested, the solutions in the present disclosure can stimulate an operation state of a train and perform a joint test on the vehicle on-board controller, the electromagnet controller and the electromagnet under the simulated operation state of the train, thereby performing function verification on the vehicle on-board controller, the electromagnet controller and the electromagnet, and reducing a failure rate when the vehicle on-board controller, the electromagnet controller and the electromagnet are used simultaneously.

To make the above objects, features and advantages of the present disclosure more apparent and easier to be understood, preferred embodiments are illustrated in detail in conjunction with the drawings hereinafter.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

REFERENCE NUMERALS ARE LISTED AS FOLLOWS

100—Central control unit;
102—Vehicle on-board controller test-bed;
104—Electromagnet controller test platform;
106—Electromagnet test-bed;
1020—Control cabinet of vehicle on-board controller test-bed;
1022—Mounting table of vehicle on-board controller;
1024—Vehicle on-board controller;
1040—Electromagnet controller test-bed;
1042—First high-voltage DC power supply cabinet;
1044—Control cabinet of electromagnet controller;
1046—Load cabinet;
1048—Circuit breaker and switchgear;
1050—Levitation controller;
1052—Steering controller;
1054—Brake controller;
1060—Electromagnet mounting table;
1062—Second high-voltage DC power supply cabinet;
1064—Electromagnet control cabinet;
1066—Levitation electromagnet;
1068—Steering electromagnet; and
1070—Brake electromagnet.

DETAILED DESCRIPTION OF EMBODIMENTS

At present, there is no test apparatus for testing a vehicle on-board controller, an electromagnet controller and an electromagnet in a high-speed magnetic levitation train, resulting in that the vehicle on-board controller, the electromagnet controller and the electromagnet cannot be tested. In view of this, a magnetic levitation test system and an electromagnet test method are provided in the embodiments of the present disclosure, to perform joint test on the vehicle on-board controller, the electromagnet controller and the electromagnet.

Embodiments

Figure 1:
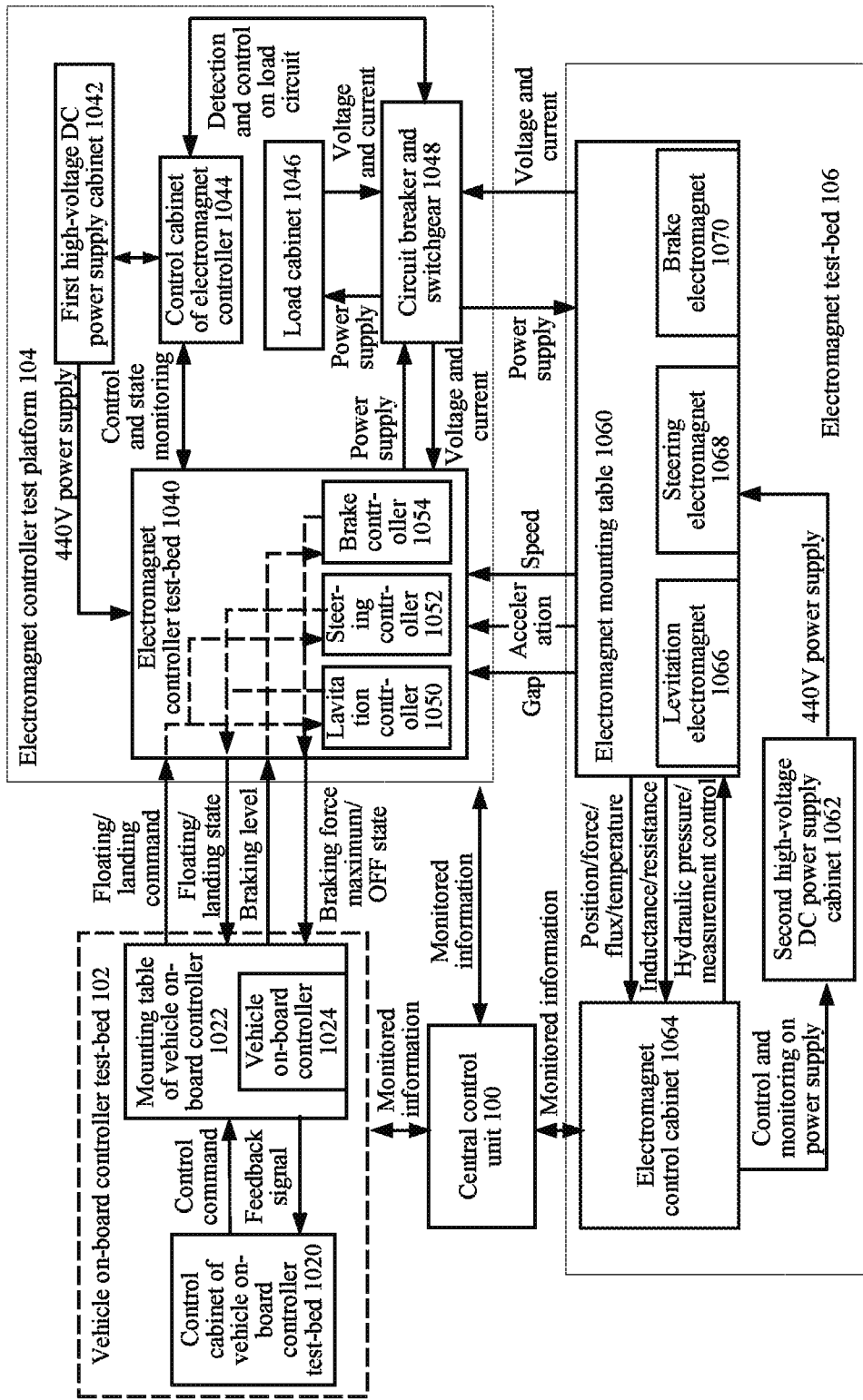
FIG. 1 shows a schematic structural diagram of a magnetic levitation test system according to an embodiment of the present disclosure.

Reference is made to FIG. 1, which shows a schematic structural diagram of a magnetic levitation test system. The magnetic levitation test system according to the embodiment includes: a central control unit 100, a vehicle on-board controller test-bed 102, an electromagnet controller test platform 104, and an electromagnet test-bed 106.

The central control unit 100 is respectively connected to the vehicle on-board controller test-bed 102, the electromagnet controller test platform 104 and the electromagnet test-bed 106. The vehicle on-board controller test-bed 102 is connected to the electromagnet controller test platform 104. The electromagnet controller test platform 104 is connected to the electromagnet test-bed 106.

An electromagnet is mounted on the electromagnet test-bed 106.

The central control unit 100 is configured to transmit a control command to the vehicle on-board controller test-bed 102.

The vehicle on-board controller test-bed 102 is configured to transmit the control command to the electromagnet controller test platform 104.

The electromagnet controller test platform 101 is configured to generate an electromagnet test command based on the control command, to test the electromagnet mounted on the electromagnet test-bed 106.

The electromagnet test-bed 106 is configured to execute the electromagnet test command transmitted from the electromagnet controller test platform 104, to test the mounted electromagnet.

In an embodiment, the central control unit 100 is configured to simulate a control command transmitted from a train control system and receive a speed, an acceleration, and a gap value of the electromagnet in testing.

The central control unit 100 may be configured as any computing device capable of controlling the vehicle on-board controller test-bed 102, the electromagnet controller test platform 104 and the electromagnet test-bed 106 according to the conventional technology, which is not repeated herein.

In order to test a vehicle on-board controller, specifically, the vehicle on-board controller test-bed 102 includes: a control cabinet 1020 of the vehicle on-board controller test-bed, a mounting table 1022 of a vehicle on-board controller, and a vehicle on-board controller 1024.

The vehicle on-board controller 1024 is mounted on the mounting table 1022 of the vehicle on-board controller. The mounting table 1022 of the vehicle on-board controller is provided with an electrical connection interface for connecting to an electromagnet controller test-bed 1040 in the electromagnet controller test platform 104.

The control cabinet 1020 of the vehicle on-board controller test-bed is configured to transmit the control command transmitted from the central control unit 100 to the vehicle on-board controller 1024, and monitor a response output from the vehicle on-board controller 1024.

The vehicle on-board controller 1024 is configured to transmit the control command to the electromagnet controller test platform 104.

In an embodiment, the vehicle on-board controller 1024 transmits the control command to the electromagnet controller test-bed 1040 in the electromagnet controller test platform 104 via the electrical connection interface of the mounting table 1022 of the vehicle on-board controller.

The electromagnet controller test platform 104 includes: an electromagnet controller test-bed 1040, a first high-voltage direct current power supply cabinet 1042, a control cabinet 1044 of an electromagnet controller, a load cabinet 1046, a circuit breaker and switchgear 1048, and an electromagnet controller.

The electromagnet controller test-bed 1040 is respectively connected to the control cabinet 1044 of the electromagnet controller and the circuit breaker and switchgear 1048. The circuit breaker and switchgear 1048 is respectively connected to the control cabinet 1044 of the electromagnet controller and the load cabinet 1046.

The electromagnet controller includes: a levitation controller 1050, a steering controller 1052 and a brake controller 1054. The levitation controller 1050, the steering controller 1052 and the brake controller 1054 are mounted on the electromagnet controller test-bed 1040.

The electromagnet controller test-bed 1040 is provided with electrical connection interfaces for respectively connecting to the mounting table 1022 of the vehicle on-board controller and an electromagnet mounting table 1060. Thus, the electromagnet controller test-bed 1040 may receive the control command transmitted from the vehicle on-board controller 1024 via an electrical connection interface for connecting to the mounting table 1022 of the vehicle on-board controller, and may also transmit a control command for testing the electromagnet controller to the electromagnet mounting table via an electrical connection interface for connecting to the electromagnet mounting table 1060.

The control cabinet 1044 of the electromagnet controller is respectively connected to the levitation controller 1050, the steering controller 1052 and the brake controller 1054. The control cabinet 1044 of the electromagnet controller controls input signals of the levitation controller 1050, the steering controller 1052 and the brake controller 1054, collects outputs of the levitation controller 1050, the steering controller 1052 and the brake controller 1054 and records data, and performs function tests on the levitation controller 1050, the steering controller 1052 and the brake controller 1054 in a certain order.

The first high-voltage direct current power supply cabinet 1042 supplies power to the electromagnet controller test-bed 1040 and the control cabinet 1044 of the electromagnet controller.

The electromagnet controller test-bed 1040 is configured to receive the control command transmitted from the vehicle on-board controller 1024, and transmit the control command to the levitation controller 1050, the steering controller 1052 or the brake controller 1054, for the levitation controller 1050, the steering controller 1052 or the brake controller 1054 to control the electromagnet mounted on the electromagnet test-bed 106. The electromagnet controller test-bed 1040 is further configured to simulate a travelling speed of a magnetic levitation train and transmit the simulated travelling speed of the magnetic levitation train to the steering controller 1052. The electromagnet includes a levitation electromagnet 1066, a steering electromagnet 1068 and a brake electromagnet 1070.

The load cabinet 1046 is configured to provide an adjustable load for the function test of the electromagnet controller.

The circuit breaker and switchgear 1048 is configured to control an on-off state between the test-bed and a load.

Figure 2:
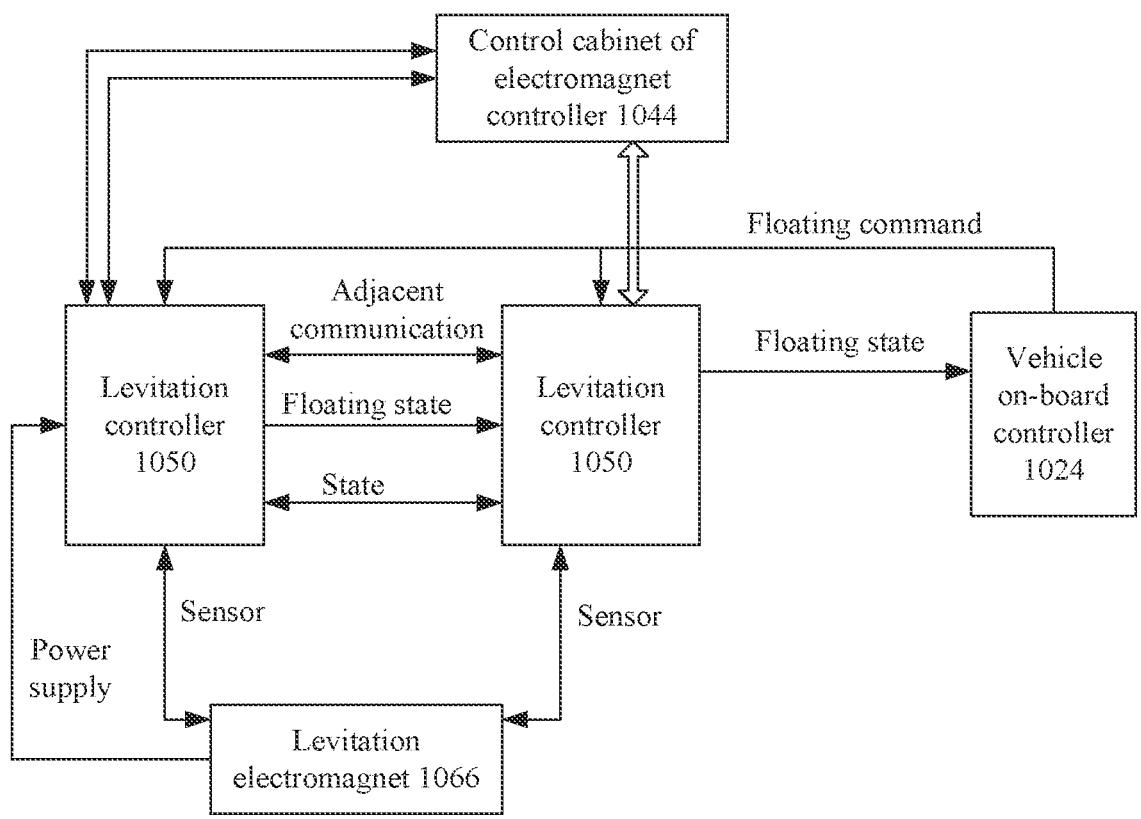
FIG. 2 shows a communication flow chart of a levitation controller in a magnetic levitation test system according to an embodiment of the present disclosure.

Reference is made to FIG. 2, which shows a communication flow chart of a levitation controller according to an embodiment of the present disclosure. In an embodiment, in a case that the control command is a first floating command, the first floating command carries a gap value between the levitation electromagnet 1066 and a long stator.

The levitation controller 1050 is configured to determine an output voltage corresponding to a gap value between the levitation electromagnet 1066 and the long stator based on a relationship between gap values and output voltages, in response to receiving the first floating command transmitted from the electromagnet controller test-bed 1040, and supply power to the levitation electromagnet 1066 on the electromagnet test-bed 106 through the circuit breaker and switchgear 1048 based on the determined output voltage, for a gap between the levitation electromagnet 1066 and the long stator to reach the gap value between the levitation electromagnet and the long stator carried in the first floating command; obtain a speed, an acceleration, and a gap value when the levitation electromagnet 1066 is floating, and transmit the obtained speed, acceleration, and gap value when the levitation electromagnet 1066 is floating to the vehicle on-board controller 1024.

The vehicle on-board controller 1024 is configured to transmit the speed, the acceleration, and the gap value when the levitation electromagnet 1066 is floating to the central control unit 100, in response to receiving the speed, the acceleration, and the gap value when the levitation electromagnet 1066 is floating transmitted from the levitation controller 1050.

The levitation controller 1050 may pre-store the relationship between gap values and output voltages.

The speed, acceleration, and gap value when the levitation electromagnet is floating may be collected by a sensor mounted on the levitation electromagnet. Therefore, the levitation controller may obtain, from the sensor mounted on the levitation electromagnet, a speed, an acceleration, and a gap value of a levitation sensor upon floating.

Figure 3:
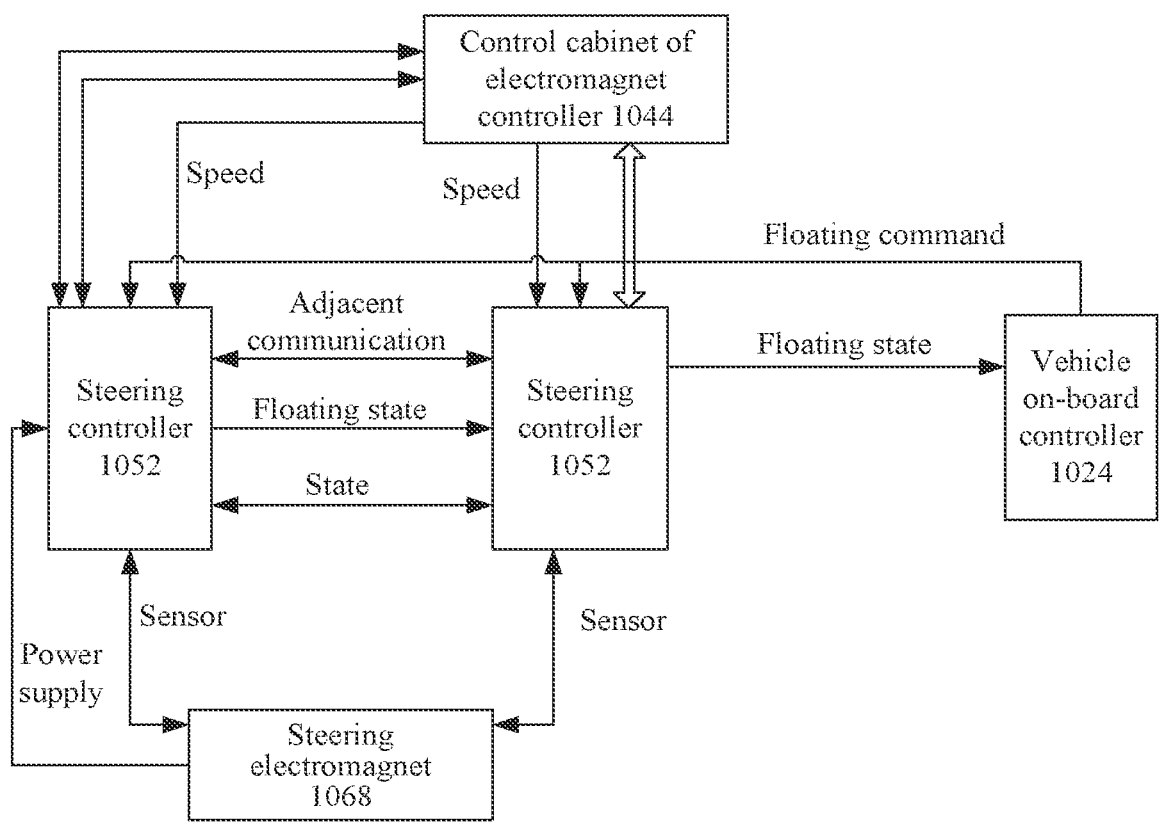
FIG. 3 shows a communication flow chart of a steering controller in a magnetic levitation test system according to an embodiment of the present disclosure.

Reference is made to FIG. 3, which shows a communication flow chart of a steering controller. In an embodiment, in a case that the control command is a second floating command, the second floating command carries a gap value between the steering electromagnet 1068 and a long stator.

The steering controller 1052 is configured to determine an output voltage corresponding to the gap value between the steering electromagnet 1068 and the long stator based on a relationship between gap values and output voltages, in response to receiving the second floating command transmitted from the electromagnet controller test-bed 1040, and supply power to the steering electromagnet 1068 on the electromagnet test-bed 106 through the circuit breaker and switchgear 1048 based on the determined output voltage, for a gap between the steering electromagnet and the long stator to reach the gap value between the steering electromagnet and the long stator carried in the second floating command; and obtain a speed, an acceleration, and a gap value when the steering electromagnet 1068 is floating and transmit the obtained speed, acceleration, and gap value when the steering electromagnet 1068 is floating to the vehicle on-board controller 1024.

The vehicle on-board controller 1024 is configured to transmit the speed, acceleration, and gap value of the steering electromagnet 1068 while the steering electromagnet 1068 is floating to the central control unit 100, in response to receiving the speed, acceleration, and gap value of the steering electromagnet 1068 while the steering electromagnet 1068 is floating transmitted from the steering controller 1052.

The steering controller 1052 may pre-store the relationship between gap values and output voltages.

The speed, acceleration, and gap value when the steering electromagnet 1068 is floating may be collected by a sensor mounted on the steering electromagnet. Therefore, the steering controller 1052 may obtain, from the sensor mounted on the steering electromagnet 1068, a speed, an acceleration, and a gap value of a steering sensor upon floating.

Further, the levitation controller 1050 and the steering controller 1052 may respectively execute a landing command, for the levitation electromagnet 1066 and the steering electromagnet 1068 to restore from a floating state to an initial state. The process of executing a landing command respectively by the levitation controller 1050 and the steering controller 1052 is similar to the process of executing the floating command, which is not repeated herein.

Figure 4:
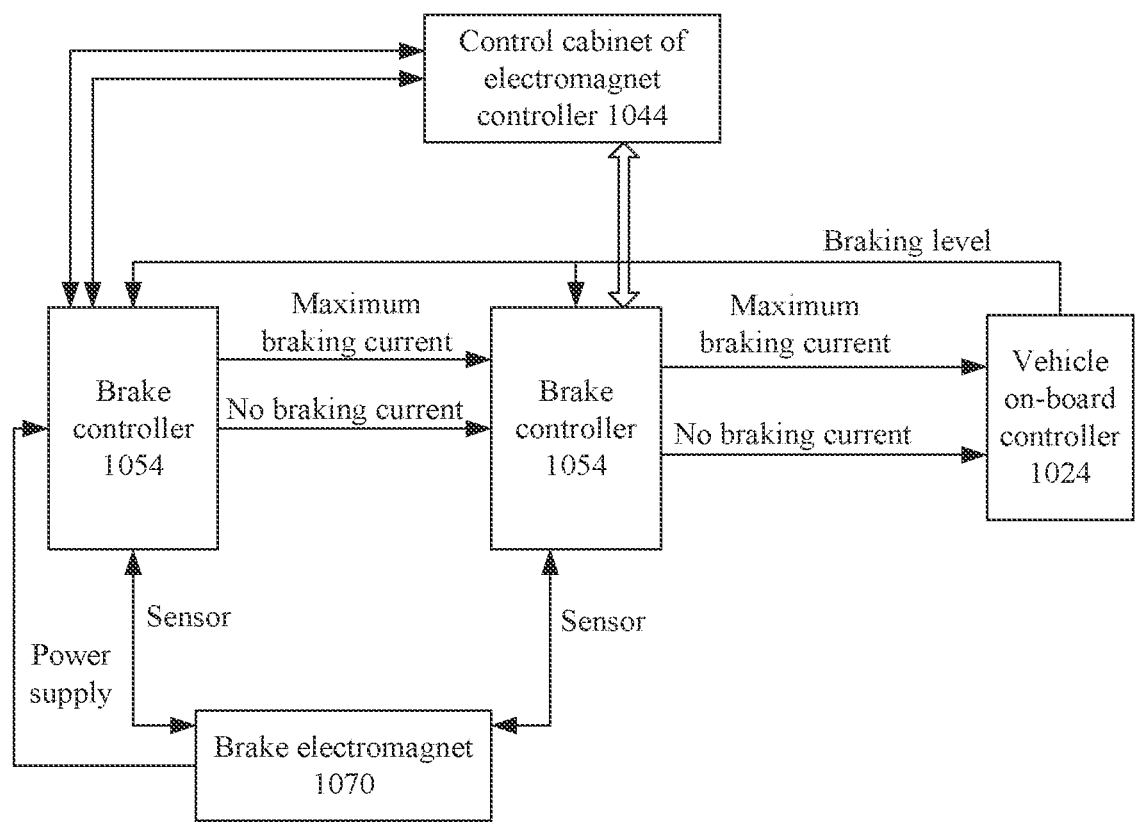
FIG. 4 shows a communication flow chart of a brake controller in a magnetic levitation test system according to an embodiment of the present disclosure.

Reference is made to FIG. 4, which shows a communication flow chart of a brake controller. In an embodiment, in a case that the control command is a brake command, the brake command carries a braking level of the brake electromagnet 1070.

The brake controller 1054 is configured to determine an output voltage corresponding to the braking level carried in the brake command based on a relationship between braking levels and output voltages, in response to receiving the brake command from the electromagnet controller test-bed 1040, and supply power to the brake electromagnet 1070 on the electromagnet test-bed 106 through the circuit breaker and switchgear 1048 based on the determined output voltage, for the brake electromagnet 1070 to perform braking operation based on the braking level carried in the brake command; and obtain a speed, an acceleration, and a gap value when the brake electromagnet 1070 is performing braking operation and transmit the obtained speed, acceleration, and gap value when the brake electromagnet 1070 is performing braking operation to the vehicle on-board controller 1024.

The vehicle on-board controller 1024 is configured to transmit the speed, acceleration, and gap value when the brake electromagnet is performing braking operation to the central control unit 100, in response to receiving the speed, acceleration, and gap value when the brake electromagnet is performing braking operation transmitted from the brake controller.

The brake controller 1054 may pre-store the relationship between braking levels and output voltages.

The speed, acceleration, and gap value when the brake electromagnet 1070 is performing braking operation may be collected by a sensor mounted on the brake electromagnet 1070. Therefore, the brake controller 1054 may obtain, from the sensor mounted on the brake electromagnet 1070, a speed, an acceleration and a gap value of a brake sensor upon performing braking operation.

In order to test the electromagnet, the electromagnet test-bed 106 may include: an electromagnet mounting table 1060, a second high-voltage direct current power supply cabinet 1062, an electromagnet control cabinet 1064, a levitation electromagnet 1066, a steering electromagnet 1068, and a brake electromagnet 1070.

The electromagnet control cabinet 1064 is respectively connected to the electromagnet mounting table 1060 and the second high-voltage direct current power supply cabinet 1062. The second high-voltage direct current power supply cabinet 1062 is connected to the electromagnet mounting table 1060. The levitation electromagnet 1066, the steering electromagnet 1068 and the brake electromagnet 1070 are mounted on the electromagnet mounting table 1060.

The electromagnet control cabinet 1064 is configured to obtain monitored information of the levitation electromagnet 1066, the steering electromagnet 1068 and the brake electromagnet 1070 in testing and transmit the obtained monitored information to the central control unit 100; and control the second high-voltage direct current power supply cabinet 1062 to supply power to the levitation electromagnet 1066, the steering electromagnet 1068 and the brake electromagnet 1070 on the electromagnet mounting table 1060.

The monitored information includes: a gap value between the levitation electromagnet and the long stator, a gap value between the steering electromagnet and the long stator, a speed and an acceleration of the train, and a voltage across the electromagnet, and a current flowing through the electromagnet.

The electromagnet mounting table 1060 is provided with an electrical connection interface for connecting to the electromagnet controller test-bed 1040, thus the electromagnet mounting table 1060 may receive the control command for testing the electromagnet transmitted from the electromagnet controller via the electrical connection interface for connecting to the electromagnet controller test-bed 1040.

The second high-voltage direct current power supply cabinet 1062 is configure to supply power for testing the electromagnet.

The magnetic levitation test system according to the embodiment not only may perform a joint test on the vehicle on-board controller 1024, the electromagnet controller and the electromagnet, but also may test the vehicle on-board controller, the electromagnet controller and the electromagnet respectively.

Electromagnet test methods, applied to the magnetic levitation test system, are respectively provided in embodiments, to control the levitation electromagnet, the steering electromagnet, and the brake electromagnet respectively.

In an embodiment, in order to control the levitation electromagnet, the electromagnet test method may include the following steps (1) to (3).

In step (1), a levitation controller receives a first floating command transmitted from an electromagnet controller test-bed. The first floating command carries a gap value between the levitation electromagnet and a long stator.

In step (2), it is to determine an output voltage corresponding to the gap value between the levitation electromagnet and the long stator based on a relationship between gap values and output voltages, and to supply power to the levitation electromagnet on the electromagnet test-bed through a circuit breaker and switchgear based on the determined output voltage, for gap between the levitation electromagnet and the long stator to reach the gap value between the levitation electromagnet and the long stator carried in the first floating command.

In step (3), it is to obtain a speed, an acceleration, and a gap value when the levitation electromagnet is floating, and transmit the obtained speed, acceleration, and gap value when the levitation electromagnet is floating to the vehicle on-board controller.

In an embodiment, in order to control the steering electromagnet, the electromagnet test method may include the following steps (1) to (3).

In step (1), the steering controller receives a second floating command transmitted from a electromagnet controller test-bed. The second floating command carries a gap value between the steering electromagnet and a long stator.

In step (2), it is to determine an output voltage corresponding to the gap value between the steering electromagnet and the long stator based on a relationship between gap values and output voltages, and supply power to the steering electromagnet on the electromagnet test-bed through a circuit breaker and switchgear based on the determined output voltage, for a gap between the steering electromagnet and the long stator to reach the gap value between the steering electromagnet and the long stator carried in the second floating command.

In step (3), it is to obtain a speed, an acceleration, and a gap value when the steering electromagnet is floating, and transmit the obtained speed, acceleration, and gap value when the steering electromagnet is floating to the vehicle on-board controller.

In an embodiment, in order to control the brake electromagnet, the electromagnet test method may include the following steps (1) to (3).

In step (1), the brake controller receives a brake command transmitted from an electromagnet controller test-bed. The brake command carries a braking level of the brake electromagnet.

In step (2), it is to determine an output voltage corresponding to the braking level carried in the brake command based on a relationship between braking levels and output voltages, and supply power to the brake electromagnet on the electromagnet test-bed through a circuit breaker and switchgear based on the determined output voltage, for the brake electromagnet to perform braking operation based on the braking level carried in the brake command.

In step (3), it is to obtain a speed, an acceleration, and a gap value when the brake electromagnet is performing braking operation, and transmit the obtained speed, acceleration, and gap value when the brake electromagnet is performing braking operation to the vehicle on-board controller.

In view of the above, with the magnetic levitation test system and the electromagnet test method according to the embodiments, a joint test is performed on the vehicle on-board controller, the electromagnet controller and the electromagnet by using the magnetic levitation test system integrated with the vehicle on-board controller test-bed, the electromagnet controller test platform and the electromagnet test-bed. Compared with the conventional technology in which the vehicle on-board controller, the electromagnet controller and the electromagnet cannot be tested, the solutions in the present disclosure can stimulate an operation state of a train and perform a joint test on the vehicle on-board controller, the electromagnet controller and the electromagnet under the simulated operation state of the train, thereby performing function verification on the vehicle on-board controller, the electromagnet controller and the electromagnet, and reducing a failure rate when the vehicle on-board controller, the electromagnet controller and the electromagnet are used simultaneously.

The above are only specific embodiments of the present disclosure, but the scope of protection of the present disclosure is not limited thereto. Changes and substitutions which may be easily thought by those skilled in the art within the technical scope disclosed in the present disclosure should fall within the scope of protection of the present disclosure.

The invention claimed is:

1. A magnetic levitation test system, comprising: a central control unit, a vehicle on-board controller test-bed, an electromagnet controller test platform, and an electromagnet test-bed, wherein the central control unit is respectively connected to the vehicle on-board controller test-bed, the electromagnet controller test platform and the electromagnet test-bed; the vehicle on-board controller test-bed is connected to the electromagnet controller test platform; and the electromagnet controller test platform is connected to the electromagnet test-bed;

an electromagnet is mounted on the electromagnet test-bed;

the central control unit is configured to transmit a control command to the vehicle on-board controller test-bed;

the vehicle on-board controller test-bed is configured to transmit the control command to the electromagnet controller test platform;

the electromagnet controller test platform is configured to generate an electromagnet test command based on the control command, to test the electromagnet mounted on the electromagnet test-bed; and the electromagnet test-bed is configured to execute the electromagnet test command transmitted from the electromagnet controller test platform, to test the mounted electromagnet;

wherein the vehicle on-board controller test-bed comprises: a control cabinet of the vehicle on-board controller test-bed, a mounting table of a vehicle on-board controller, and a vehicle on-board controller, the vehicle on-board controller is mounted on the mounting table of the vehicle on-board controller, the mounting table of the vehicle on-board controller is provided with an electrical connection interface for connecting to an electromagnet controller test-bed in the electromagnet controller test platform, the control cabinet of the vehicle on-board controller test-bed is configured to transmit the control command transmitted from the central control unit to the vehicle on-board controller, and the vehicle on-board controller is configured to transmit the control command to the electromagnet controller test platform;

wherein the electromagnet controller test platform comprises: an electromagnet controller test-bed, a first high-voltage direct current power supply cabinet, a control cabinet of an electromagnet controller, a load cabinet, a circuit breaker and switchgear, and an electromagnet controller, the electromagnet controller test-bed is respectively connected to the control cabinet of the electromagnet controller and the circuit breaker and switchgear, the circuit breaker and switchgear is respectively connected to the control cabinet of the electromagnet controller and the load cabinet, the electromagnet controller comprises: a levitation controller, a steering controller and a brake controller, the levitation controller, the steering controller and the brake controller are mounted on the electromagnet controller test-bed, the first high-voltage direct current power supply cabinet is configured to supply power to the electromagnet controller test-bed and to the control cabinet of the electromagnet controller, the electromagnet controller test-bed is configured to: receive the control command transmitted from the vehicle on-board controller, transmit the control command to the levitation controller, the steering controller or the brake controller, for the levitation controller, the steering controller or the brake controller to control the electromagnet mounted on the electromagnet test-bed, and simulate a travelling speed of a magnetic levitation train and transmit the simulated travelling speed of the magnetic levitation train to the steering controller, and the electromagnet comprises a levitation electromagnet, a steering electromagnet and a brake electromagnet; and wherein the electromagnet test-bed comprises: an electromagnet mounting table, a second high-voltage direct current power supply cabinet, an electromagnet control cabinet, a levitation electromagnet, a steering electromagnet, and a brake electromagnet, the electromagnet control cabinet is respectively connected to the electromagnet mounting table and the second high-voltage direct current power supply cabinet, the second high-voltage direct current power supply cabinet is connected to the electromagnet mounting table, the levitation electromagnet, the steering electromagnet and the brake electromagnet are mounted on the electromagnet mounting table, the electromagnet control cabinet is configured to: obtain monitored information of the levitation electromagnet, the steering electromagnet and the brake electromagnet in testing, transmit the obtained monitored information to the central control unit, and control the second high-voltage direct current power supply cabinet to supply power to the levitation electromagnet, the steering electromagnet and the brake electromagnet on the electromagnet mounting table.

2. The magnetic levitation test system according to claim 1, wherein in a case that the control command is a first floating command, the first floating command carries a gap value between the levitation electromagnet and a long stator; and the levitation controller is configured to:

determine an output voltage corresponding to the gap value between the levitation electromagnet and the long stator based on a relationship between gap values and output voltages, in response to receiving the first floating command transmitted from the electromagnet controller test-bed, and supply power to the levitation electromagnet on the electromagnet test-bed through the circuit breaker and switchgear based on the determined output voltage, for a gap between the levitation electromagnet and the long stator to reach the gap value between the levitation electromagnet and the long stator carried in the first levitation command; and obtain a speed, an acceleration, and a gap value when the levitation electromagnet is floating, and transmit the obtained speed, acceleration, and gap value when the levitation electromagnet is floating to the vehicle on-board controller.

3. The magnetic levitation test system according to claim 1, wherein in a case that the control command is a second floating command, the second floating command carries a gap value between the steering electromagnet and a long stator; and the steering controller is configured to:

determine an output voltage corresponding to the gap value between the steering electromagnet and the long stator based on a relationship between gap values and output voltages, in response to receiving the second floating command transmitted from the electromagnet controller test-bed, and supply power to the steering electromagnet on the electromagnet test-bed through the circuit breaker and switchgear based on the determined output voltage, for a gap between the steering electromagnet and the long stator to reach the gap value between the steering electromagnet and the long stator carried in the second floating command; and obtain a speed, an acceleration, and a gap value of the steering electromagnet when the steering electromagnet is floating, and transmit the obtained speed, acceleration, and gap value when the steering electromagnet is floating to the vehicle on-board controller.

4. The magnetic levitation test system according to claim 1, wherein in a case that the control command is a brake command, the brake command carries a braking level of the brake electromagnet, and the brake controller is configured to:

determine an output voltage corresponding to the braking level carried in the brake command based on a relationship between braking levels and output voltages, in response to receiving the brake command transmitted from the electromagnet controller test-bed, and supply power to the brake electromagnet on the electromagnet test-bed through the circuit breaker and switchgear based on the determined output voltage, for the brake electromagnet to perform braking operation based on the braking level carried in the brake command; and obtain a speed, an acceleration, and a gap value when the brake electromagnet is performing braking operation, and transmit the obtained speed, acceleration, and gap value when the brake electromagnet is performing braking operation to the vehicle on-board controller.

5. An electromagnet test method, applied to the magnetic levitation test system according to claim 1, comprising:

receiving, by a levitation controller, a first floating command transmitted from an electromagnet controller test-bed, wherein the first floating command carries a gap value between a levitation electromagnet and a long stator;

determining an output voltage corresponding to the gap value between the levitation electromagnet and the long stator based on a relationship between gap values and output voltages, and supplying power to the levitation electromagnet on the electromagnet test-bed through a circuit breaker and switchgear based on the determined output voltage, for a gap between the levitation electromagnet and the long stator to reach the gap value between the levitation electromagnet and the long stator carried in the first floating command; and obtaining a speed, an acceleration, and a gap value when the levitation electromagnet is floating, and transmitting the obtained speed, acceleration, and gap value when the levitation electromagnet is floating to a vehicle on-board controller.

6. An electromagnet test method, applied to the magnetic levitation test system according to claim 1, comprising:
receiving, by a steering controller, a second floating command transmitted from an electromagnet controller test-bed, wherein the second floating command carries a gap value between a steering electromagnet and a long stator;
determining an output voltage corresponding to the gap value between the steering electromagnet and the long stator based on a relationship between gap values and output voltages, and supplying power to the steering electromagnet on the electromagnet test-bed through a circuit breaker and switchgear based on the determined output voltage, for a gap between the steering electromagnet and the long stator to reach the gap value between the steering electromagnet and the long stator carried in the second floating command; and
obtaining a speed, an acceleration, and a gap value when the steering electromagnet is floating, and transmitting the obtained speed, acceleration, and gap value when the steering electromagnet is floating to a vehicle on-board controller.

7. An electromagnet test method, applied to the magnetic levitation test system according to claim 1, comprising:
receiving, by a brake controller, a brake command transmitted from an electromagnet controller test-bed, wherein the brake command carries a braking level of a brake electromagnet;
determining an output voltage corresponding to the braking level carried in the brake command based on a relationship between braking levels and output voltages, and supplying power to the brake electromagnet on the electromagnet test-bed through a circuit breaker and switchgear based on the determined output voltage, for the brake electromagnet to perform braking operation based on the braking level carried in the brake command; and
obtaining a speed, an acceleration, and a gap value when the brake electromagnet is performing braking operation, and transmitting the obtained speed, acceleration, and gap value when the brake electromagnet is performing braking operation to a vehicle on-board controller.

* * * * *